US010789124B2

(12) United States Patent
Chen et al.

(10) Patent No.: US 10,789,124 B2
(45) Date of Patent: Sep. 29, 2020

(54) TECHNIQUES TO A SET VOLTAGE LEVEL FOR A DATA ACCESS

(71) Applicant: Intel Corporation, Santa Clara, CA (US)

(72) Inventors: Lei Chen, Sunnyvale, CA (US); Xin Guo, San Jose, CA (US); Shu-Jen Lee, Folsom, CA (US); Chu-hsiang Teng, Rancho Cordova, CA (US); Scott Nelson, Vancouver (CA); Donia Sebastian, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/145,983

(22) Filed: Sep. 28, 2018

(65) Prior Publication Data

US 2019/0042356 A1 Feb. 7, 2019

(51) Int. Cl.
*G06F 11/10* (2006.01)
*G11C 16/26* (2006.01)
*G11C 16/34* (2006.01)
*G11C 29/02* (2006.01)
*G11C 29/04* (2006.01)

(52) U.S. Cl.
CPC .......... *G06F 11/1012* (2013.01); *G11C 16/26* (2013.01); *G11C 16/3431* (2013.01); *G11C 29/021* (2013.01); *G11C 29/028* (2013.01); *G11C 2029/0409* (2013.01); *G11C 2029/0411* (2013.01)

(58) Field of Classification Search
CPC . G06F 11/1012; G11C 16/3431; G11C 16/26; G11C 2029/0411; G11C 2029/409; G11C 29/028; G11C 29/021
See application file for complete search history.

(56) References Cited

U.S. PATENT DOCUMENTS

| 8,046,628 B2 * | 10/2011 | Resnick | ............... G06F 11/073 714/52 |
| 8,111,549 B2 | 2/2012 | Yip | |
| 8,508,995 B2 * | 8/2013 | Weingarten | ......... G11C 11/5628 365/185.09 |

(Continued)

OTHER PUBLICATIONS

Anand V., "A Method of Error Detection and Correction Using Euclidean Geometry Low Density Parity Check Codes", International Journal of Science and Research (IJSR)—ISSN (Online): 2319-7064—vol. 4 Issue 2, Feb. 2015 (Year: 2015).*

*Primary Examiner* — April Y Blair
*Assistant Examiner* — Matthew W Wahlin
(74) *Attorney, Agent, or Firm* — Compass IP Law PC

(57) ABSTRACT

Examples described herein can be used to reduce a number of re-read operations and potentially avoid data recovery operations, which can be time consuming. A determination can be made of a read voltage to apply during an operation to cause a read of data stored in a region of a memory device. The region of the memory device can be read using the read voltage. If the region is not successfully read, then an error level indication can be measured and a second read voltage can be determined for a re-read operation. If the re-read operation is not successful, then a second error level indication can be measured for the re-read operation. A third read voltage can be selected based on the change from the error level indication to the second error level indication.

18 Claims, 9 Drawing Sheets

(56) References Cited

U.S. PATENT DOCUMENTS

| | | | |
|---|---|---|---|
| 9,195,586 B2* | 11/2015 | Cometti | G06F 12/0246 |
| 9,268,631 B2 | 2/2016 | Leem et al. | |
| 9,268,635 B2* | 2/2016 | Sharon | H03M 13/1108 |
| 9,298,552 B2* | 3/2016 | Leem | G06F 11/141 |
| 9,431,130 B2* | 8/2016 | Sakurada | H03M 13/1111 |
| 9,697,905 B2* | 7/2017 | Sharon | G06F 11/1048 |
| 9,818,488 B2* | 11/2017 | Sankaranarayanan | G06F 11/0727 |
| 2011/0289388 A1 | 11/2011 | Nelson et al. | |
| 2015/0019922 A1 | 1/2015 | Leem et al. | |

\* cited by examiner

TECHNIQUES TO A SET VOLTAGE LEVEL FOR A DATA ACCESS

TECHNICAL FIELD

Various examples are described herein that relate to control of signal levels applied to a storage or memory device in order to access data.

BACKGROUND

Memory and storage devices are commonly used in computing systems, such as client or cloud computing environments. For example, smart phones, tablet computers, and laptops commonly use memory and storage devices for data storage and retrieval. Servers and data centers in cloud computing or edge computing also use memory and storage devices for data storage and retrieval.

Memory and storage devices are physical objects whose properties change over time or vary from device to device. Care is taken to provide operating conditions such as voltage or current levels that allow the devices to perform data storage and retrieval in a manner that seeks to improve the accuracy of retrieved data relative to what data what was stored or reduces the time incurred to retrieve accurate data.

DETAILED DESCRIPTION

Figure 1:
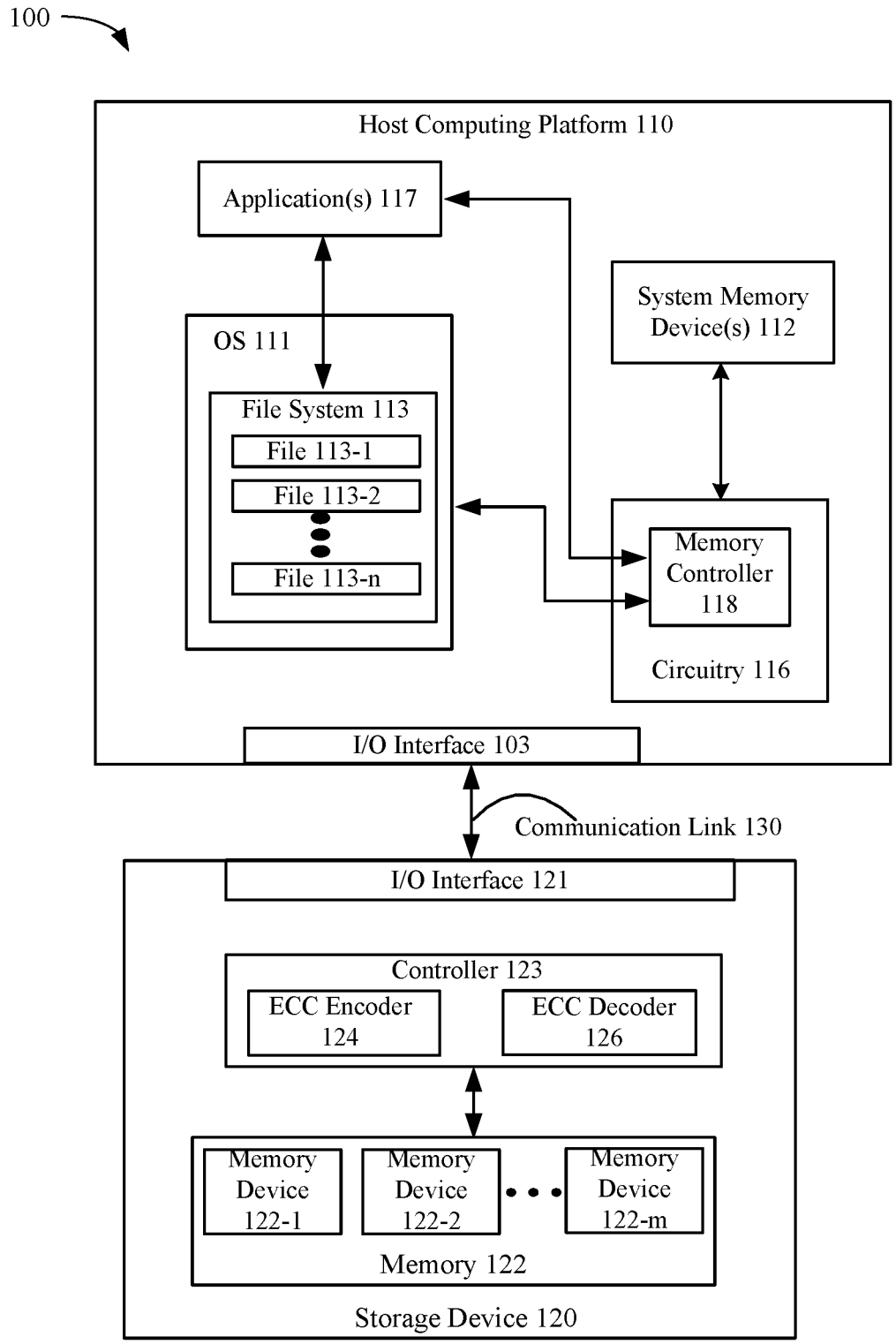
FIG. 1 illustrates an example system.

In part due to changes in operating characteristics of a memory device, the voltage applied to successfully read any region of the memory device may change over time. Together with use of error correction code (ECC) to recover data, read and re-read operations applied to memory may be needed to successfully read data. Various embodiments attempt to reduce a number of re-read operations (also referred to as moving read reference (MRR) trigger rate). Reducing a number of read and re-read operations reduces overall time to read data. For a given read failure, the voltage is adjusted and then tried again, which may or may not lead to additional ECC failures and further voltage adjustment.

Various embodiments provide for changing read voltages applied to pages, blocks, or other regions of the memory device to reduce a time incurred to read data. Use of various embodiments can lengthen the useful life of the memory device. Read voltages chosen for use can be based on reductions in raw bit error rate (RBER) as reflected, for example, by syndrome weights from one applied read voltage to a second applied read voltage. Syndrome weights can be determined using an ECC decoding technique such as low-density parity-check (LDPC). For example, a syndrome weight can represent an average syndrome weight for a code word in a plane. Each block may include several memory pages and blocks may be grouped into several planes (e.g., 4 or more). Each plane may be an independent unit and may be capable of executing various NAND operations, independent of other planes within the NAND memory die.

For example, if a read voltage V1 is applied to read data from a storage device and the read data is not successfully read, then a syndrome weight (determined using, e.g., an LDPC operation) associated with the read data can be surfaced and tracked. A read of data can be considered not successful if the region was not successfully read from memory or is successfully read from memory, but stored data is not successfully recovered. A re-read of the data can be attempted where voltage V2 can be applied to read the same or overlapping region of the memory device. If the read data using voltage V2 is not successfully recovered, then a second syndrome weight (determined using, e.g., an LDPC operation) can be surfaced and compared against the syndrome weight determined from the read using voltage V1.

If the syndrome weight decreases, it can be an indicator that the RBER is decreasing and the next selected read voltage V3 can follow the trend in terms of increasing or decreasing. For example, if V2 was less than V1, then V3 can be selected to be less than V2. Conversely, if V2 was greater than V1, the V3 can be selected to be greater than V2.

LDPC codes are linear codes characterized by a sparse parity check matrix H of dimension (n−k)×n, such that where any vector in the row space of generator matrix G of k×n is orthogonal to the rows of H, then $G \cdot H^T = 0$. A decoder can compute the (n−k)-tuple vector $s = r \cdot H^T = (s_0, s_1, \ldots s_{n-k-1})$, where $r = (r_0, r_1, \ldots r_{n-1})$ is a received codeword vector. Vectors is called a syndrome. Defining u as the data being transported and G as the generator matrix, then the encoded code word, v, is $u \cdot G$. The syndrome of an LDPC code is a vector, in which each element is the product of the received vector with each row of the parity check matrix. Each syndrome bit indicates whether each equation in $v \cdot H^T = 0$ is satisfied or not satisfied in a received codeword vector. Accordingly, syndrome s=0 if and only if r is a codeword.

As the number of bit errors increase, so does the number of unsatisfied equations in $r \cdot H^T$. Let syndrome weight Isl be the number of is in the syndrome vector s. Syndrome weight has a strong correlation with RBER and can be a good representation of RBER. It can be the case that when RBER increases, syndrome weight increases and vice versa. In some cases, when MRR is used and a read retry fails, an RBER value may not be obtained or available. However, in some cases, syndrome weight can be available no matter whether decoding is successful or not. The read voltage shift can be adjusted based on whether syndrome weight associated with a read and one or more re-reads increases, decreases, or stays the same.

Various embodiments can decrease not only the total number of re-reads but also the total number of applied soft bit reads. A soft bit read can involve reading data multiple times with 3 strobes, 5 strobes, or other number of times, and obtaining soft information (reliability information). Reliability information can be used to map a log likelihood radio (LLR) corresponding value. LDPC can use soft decision decoding to correct more errors than by hard decision decoding. However, a soft bit read can take a longer time than a hard data read (e.g., potentially three times than that of a hard data re-read directly from memory prior to error correction when three strobes are used), so it can be desirable to reduce the number of soft bit reads. Various embodiments can reduce the number of re-reads, avoid soft reads and corresponding soft read failures, and can reduce MRR trigger rate. Various embodiments can improve error recovery latency, quality of service, lifespan, and reliability of solid state drives (SSDs) or other memory devices.

Embodiments can be used in any type of storage device such as single-level cell (SLC), multi-level cell (MLC), triple level cell (TLC), Quad Level Cell (QLC) or non-volatile storage devices including 2, 4, 8, 16 levels of information, or other number of levels of information, and so forth. Other types of storage devices can use the read voltage adjustment techniques. For example, any device or memory device that uses LDPC for decoding or decoding that determines syndrome weights can use embodiments described herein. For example, parameters derived from Reed-Solomon (RS) code or a Bose, Chaudhuri, and Hocquenghem (BCH) code may be used to track error levels.

FIG. 1 illustrates an example system 100. In some examples, system 100 includes a host computing platform 110 coupled to a storage device 120 through input/output (I/O) interface 103 and I/O interface 121 and using communications link 130. Also, as shown in FIG. 1, host computing platform 110 may include an OS 111, one or more system memory device(s) 112, circuitry 116 and one or more application(s) 117. For these examples, circuitry 116 may be capable of executing various functional elements of host computing platform 110 such as OS 111 and application(s) 117 that may be maintained, at least in part, within system memory device(s) 112. Circuitry 116 may include host processing circuitry to include one or more central processing units (CPUs), processor cores, and associated chipsets and/or controllers.

In some examples, system memory device(s) 112 may store information and commands which may be used by circuitry 116 for processing information. Also, as shown in FIG. 1, circuitry 116 may include a memory controller 118. Memory controller 118 may be configured to control access to data at least temporarily stored at system memory device(s) 112 for eventual storage to storage memory device(s) 122 at storage device 120.

According to some examples, as shown in FIG. 1, OS 111 may include file system 113 or make use of a separate file system 113 to coordinate storage of data received from application(s) 117 in a file from among files 113-1 to 113-$n$, where "n" is any whole positive integer, to storage in a memory 122 at storage device 120. The data, for example, may have originated from or may be associated with executing at least regions of application(s) 117 and/or OS 111.

As shown in FIG. 1, storage device 120 includes a controller 123 coupled with memory 122. According to some examples, controller 123 may receive and/or fulfill read/write requests via communication link 130 through I/O interface 121. Storage device 120 may be a memory device for host computing platform 110. As a memory device, storage device 120 may serve as a solid state drive (SSD) for host computing platform 110.

In some examples, controller 123 may include an error correction code (ECC) encoder 124 and an ECC decoder 126. ECC encoder 124 may include logic and/or features to generate codewords to protect regions of data to be written to memory 122. ECC decoder 126 may include logic and/or features to detect and attempt to correct errors included in an ECC encoded region of data. According to some examples, the ECC used to encode the data may include, but is not limited to, an LDPC code, or in some cases, a Reed-Solomon (RS) code or a Bose, Chaudhuri, and Hocquenghem (BCH) code.

In some examples, as shown in FIG. 1, memory 122 may include memory devices 122-1 to 122-$m$, where "m" is any positive whole integer. For these examples, memory devices 122-1 to 122-$m$ may include non-volatile and/or volatile types of memory. Non-volatile types of memory may be types of memory whose state is determinate even if power is interrupted to the device. In some examples, memory devices 122-1 to 122-$m$ may be block addressable memory devices, such as NAND or NOR technologies. Memory devices 122-1 to 122-$m$ may also include non-volatile types of memory, such as 3D crosspoint memory (3DxP), or other byte addressable non-volatile memory. Memory devices 122-1 to 122-$m$ may include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types.

According to some examples, volatile types of memory included in memory devices 122-1 to 122-$m$ and/or included in system memory device(s) 112 may include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide IO 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

In some examples, communications between file system 113 and controller 123 for writing or reading of regions of data stored in memory devices(s) 122 may be routed through I/O interface 103 and I/O interface 121. For example, to couple elements of host computing platform 110 to storage device 120, I/O interfaces 103 and 121 may be configured to comply with one or more of the following standards: a Serial Advanced Technology Attachment (SATA) interface, a Serial Attached Small Computer System Interface (SCSI) (or simply SAS), a Peripheral Component Interconnect Express (PCIe) interface, or a Non-Volatile Memory Express (NVMe) interface. Communication protocols may be utilized to communicate through I/O interfaces 103 and 123 as described in industry standards or specifications (including progenies or variants) such as the Peripheral Component Interconnect (PCI) Express Base Specification, revision 3.1, published in November 2014 ("PCI Express specification" or "PCIe specification") and/or the Non-Volatile Memory Express (NVMe) Specification, revision 1.2, also published in November 2014 ("NVMe specification").

Figure 2:
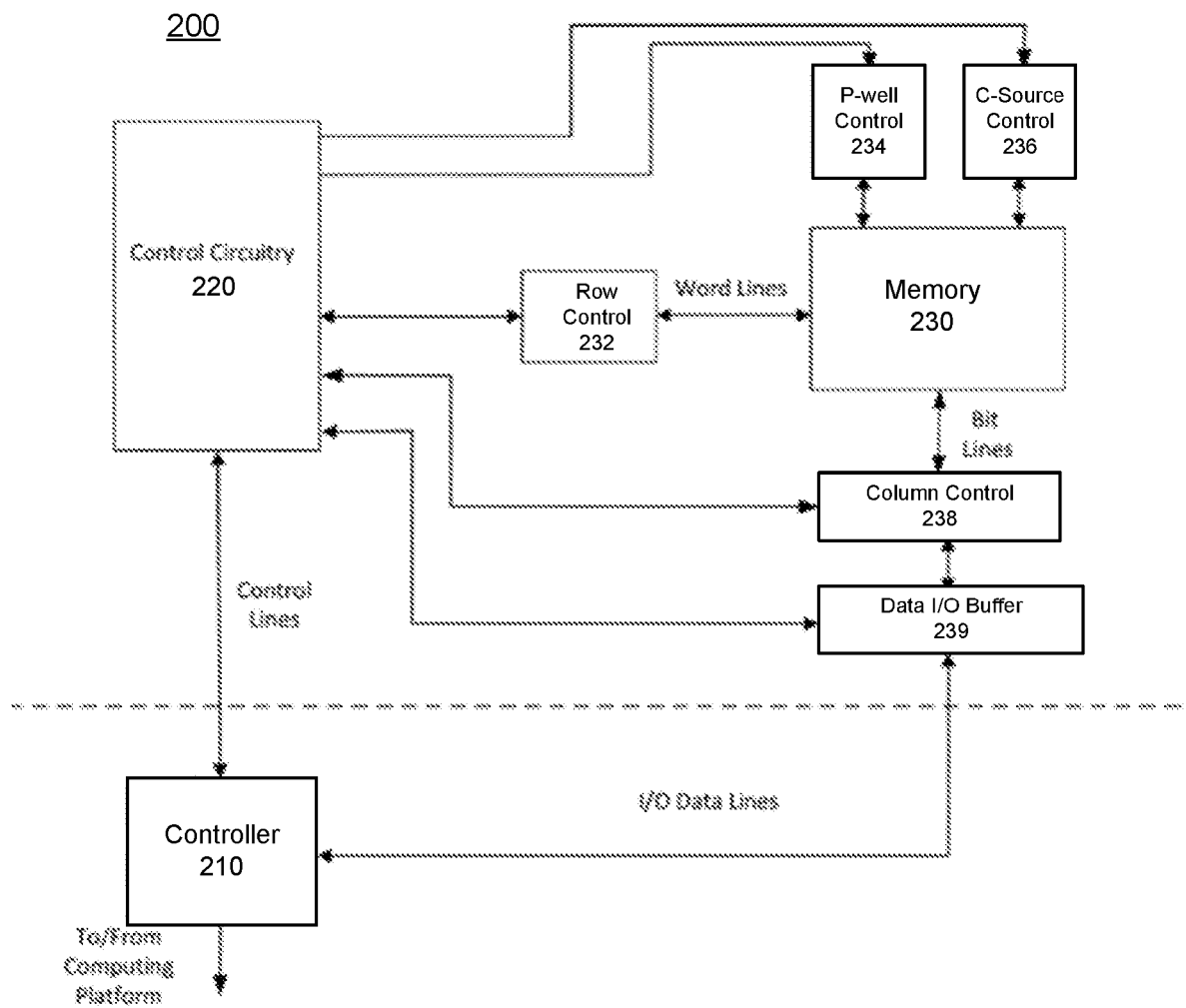
FIG. 2 illustrates a diagram of an example memory system.

FIG. 2 illustrates a diagram of an example memory system 200. Memory system 200 may include a controller 210, control circuitry 220, and a memory array 230. In some examples, various memory operations performed by memory array 230 may be controlled by row control 232, p-well control 234, c-source control 236 and column control 238. Overall operations of memory array 230 may be controlled or directed by controller 210 and/or control circuitry 220. A data input/output buffer 239 may be configured to at least temporarily store data written to or read from memory array 230. In accordance with some embodiments. controller 210 and/or control circuitry 220 can use an MRR table to select and adjust a read voltage applied during a read of memory array 230 in accordance with one or more examples described herein.

In some examples, memory array 230 may include a non-volatile type of memory and/or a volatile type of memory listed or not listed herein. According to some examples, row control 232 may be coupled to word lines of memory array 230. For these examples, row control 232 may be coupled via the word lines to select one of the word lines, apply read voltages, apply program voltages combined with bit line potential levels controlled by column control 238, and apply erase voltages. Also, column control 238 may be coupled to bit lines of memory array 230 to read data stored in the memory cells, determine a state of the memory cells during a program operation, and control potential levels of the bit lines to promote or inhibit programming and erasing. P-well control 234 may control the p-well voltage of memory array 230 and c-source control 236 may control a common source line coupled to memory array 230. Other circuitry can be used for applying selected read voltages and other signals to memory array 230.

In some examples, column control 238 may be configured to read out data stored or maintained in memory array 230 and the data may be output to external I/O data lines via data I/O buffer 239. For these examples, program data to be stored in the memory cells of memory array 230 may be input to data I/O buffer 239 via the external I/O data lines and then transferred to column control 238. As shown in FIG. 2, in some examples, the external I/O data lines may be coupled to or managed by controller 210.

According to some examples, command data for controlling elements of memory system 200 such as memory array 230 may be relayed from controller 210 via control lines coupled to control circuitry 220. The control data, for examples, may inform the elements of memory system 200 as to what operation is requested.

In some examples, controller 210 may be coupled with or configured to couple with a host system such as a computing platform or computing device. Controller 210 may communicate with elements of the computing platform to read data from or write data to memory array 230. Controller 210 may be configured to receive commands from the computing platform and forward the commands to control circuitry 220. Controller 210 may also be configured to control I/O data lines between memory system 200 and the computing platform.

According to some examples, memory system 200 may be incorporated as an integrated system that includes controller 210 on a single circuit board or other type of integrated packaging. For these examples, the integrated system may include a plurality of memory array 230 and associated control circuitry. The integrated system may be embedded as part of a computing platform or may be included in a type of configuration that may be removably coupled to a computing platform. This type of configuration may include all of the elements of memory system 200 depicted in FIG. 2 or just the elements above the dotted-line shown in FIG. 2. Controller 210 may therefore be embedded with the computing platform or may be included in a memory system that is removable from the computing platform.

Figure 3:
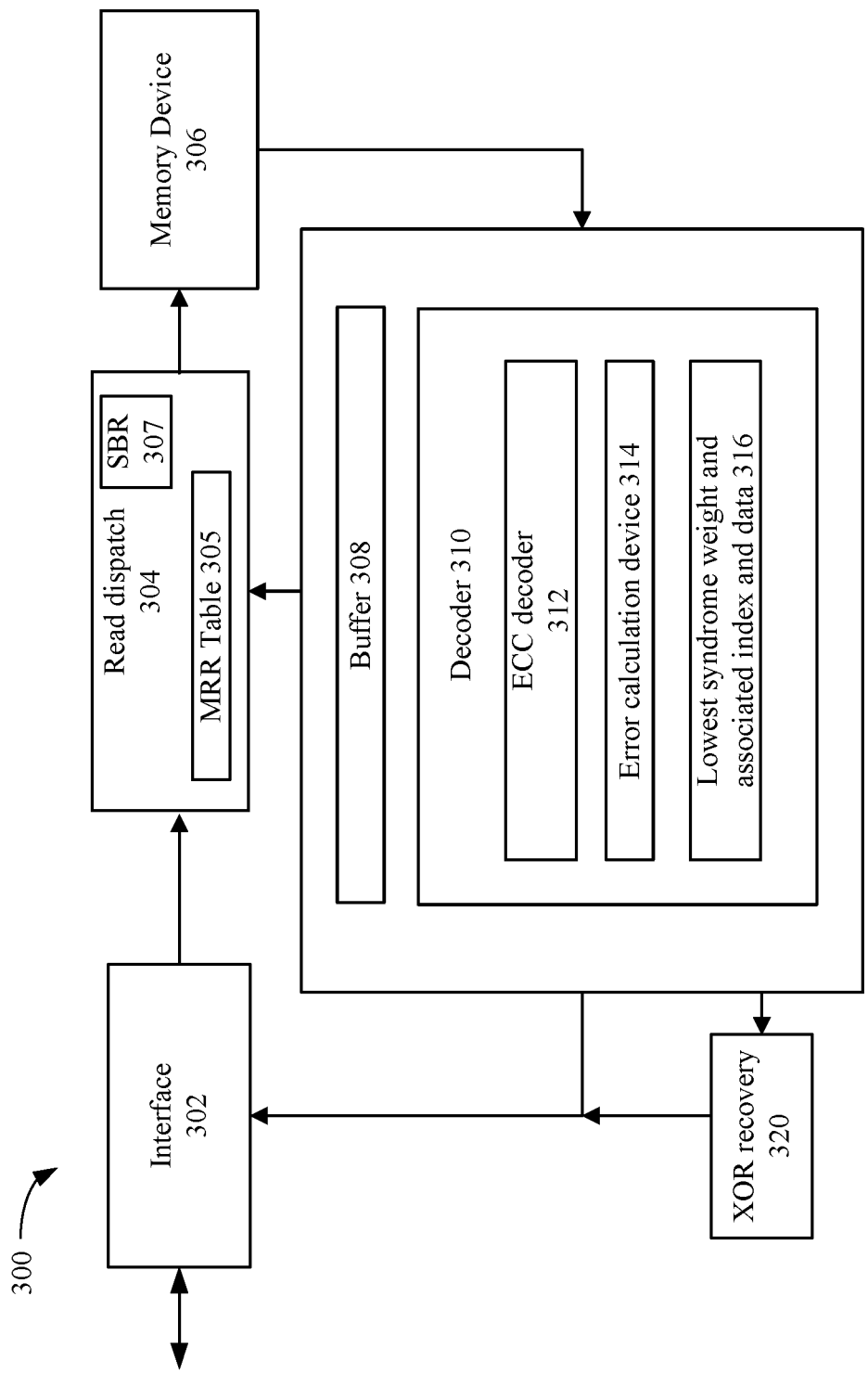
FIG. 3 illustrates an example of a read voltage determination system.

FIG. 3 shows an example of a read voltage determination system 300, in block diagram format, that can be used to determine which read voltage to apply to a memory device. The read voltage can be applied in the context of reading or re-reading data from a plane, block, page or other region of memory from a memory device or die. Components of system 300 can be applied to parallel read or re-read operations on a plane, block, page or other region of memory from a memory device or die. Various embodiments can be used in a pre-read operation used in connection with a program operation.

In some embodiments, read voltage determination system 300 can determine a read offset voltage to be applied to a reference read voltage. The read offset voltage for a data read from a memory device can be chosen based on a read offset voltage that yielded a read success in the same plane, block, page or other region of memory from a memory device or die. In the event a region of the memory device is to be re-read because of errors in read data or unsuccessful recovery of the read data, read voltage determination system 300 can select a next read offset voltage to apply in a re-read operation applied to memory device based on whether Raw Bit Error Rate (RBER) stays the same, increases or decreases. In some cases, RBER may not be obtained when ECC decoding fails, but syndrome weight can be calculated in an LDPC decoder. In some cases, a calculated syndrome weight can be used to represent RBER. For example, in the event of a read re-try, if the read fails to successfully recover and syndrome weight decreases, then the RBER also decreases, and the next applied read voltage can be moved in the same direction as prior applied read voltages (increasing or decreasing). On the other hand, in the event of a read re-try where the read re-try fails but syndrome weight increases, the RBER can be determined to increase, and the next read voltage is moved in the opposite direction of prior read voltages. Various techniques for selecting a read offset voltage in the event of a re-read are described herein.

Interface 302 can provide an interface to another device to receive data read or write requests (e.g., commands, synchronization signals, data, and/or meta data) concerning memory device 306. For example, a host device can interface with interface 302 to request a data read or other operation that triggers a determination of a read voltage to apply to a memory device 306. In response to a request received through interface 302 to initiate a read operation, read dispatch 304 can provide a read voltage level to apply to read data from memory device 306. Read dispatch 304 can access MRR table 305 to determine a read offset voltage to a read reference voltage where the sum of the read reference voltage offset by the read offset voltage is to be provided as a read voltage to memory device 306. For example, Table 1 provides an example of a table of read offset voltage values and respective associated indexes.

TABLE 1

| Read Reference Voltage | Index |
|---|---|
| 0 | 0 |
| 5 | 1 |
| 9 | 2 |
| 15 | 3 |
| 20 | 4 |
| 27 | 5 |
| 40 | 6 |

TABLE 1-continued

| Read Reference Voltage | Index |
|---|---|
| −4 | 7 |
| −8 | 8 |
| −13 | 9 |
| −20 | 10 |
| −27 | 11 |
| −33 | 12 |
| −40 | 13 |
| −47 | 14 |
| −53 | 15 |
| −60 | 16 |
| −67 | 17 |
| −73 | 18 |

A read offset voltage of zero can be assigned an index 0. Positive voltage offsets above the zero read offset voltage can be considered to the "right" of the zero voltage and their index values increase towards the "right" until a max positive voltage shift is reached. The index associated with max positive voltage shift can be denoted M. Negative shift voltages can be considered as to the "left" of the zero-offset voltage, and their indexes increase along the left direction starting M+1 (e.g., 7) to a maximum negative offset index of N. As each negative offset voltage decreases from the zero read offset voltage, its corresponding index can increase beyond M+1 up to a maximum of N. Other schemes can be used to associate read voltages with indexes. For example, an index corresponding to offset of zero can be set to be in the middle of the range of indexes of a maximum negative offset and a maximum positive offset.

In this example, M=6, which denotes the highest index value and highest read offset voltage increase relative to the zero read offset voltage. The value of M+1 is 7 and denotes a first negative read offset voltage (decrease) from the zero read offset voltage. The value of N in this example is 18 and denotes the largest decrease in the zero read offset voltage that can occur, and the largest negative offset is −73.

The offset values can represent voltage levels or can be translated into voltage levels. For example, an offset value of 5 can correspond to 5 mV or be translated into a voltage level, such as 37.5 mV. In another scheme, read offset voltages can instead represent the actual read voltage to be applied to read memory device 306, instead of an offset to a reference read voltage.

In a first attempt to read data from memory device 306, a reference offset can be selected using a prior index associated with an offset voltage that led to a read success. The prior read success can be in a same or overlapping plane, page block, or region of memory from a memory device or die as to be read from in the first attempt. In some cases, for example where no prior read success was achieved, or no read attempted, the offset voltage can be selected as zero.

In an event that read data fails to recover, one or more subsequent read operations can take place using a read offset voltage selected in a manner described herein. Read dispatch 304 can determine which read offset voltage (or read voltage) to apply for the one or more re-read operations based on information provided by decoder 310. A suitable process is described next.

(1) In response to a read operation on memory device 306, if an ECC decoding technique using LDPC applied to the read data results in the ECC failing in a snap read or a multi-plane read, the syndrome weight determined by the LDPC decoder and associated with the read operation can be stored using variable Syndrm0 and the following variables can be set:

Pre_Syndrm=Syndrm0,
Min_Syndrm=Syndrm0, and
Min_idx=sticky_voltage_index.

As an example, for a first attempt to read data from memory 306 (but not necessarily the first ever read of data from memory 306), the selected read offset voltage that lead to an error is zero, corresponding to an index=0 so Min_idx=0.

(2) Let variable entry_index be the index associated with the entry voltage from MRR table 305 that is used to re-read the region that failed to read in (1). Let sticky_voltage_index be the index of the sticky voltage, which can be the index of the reference voltage offset to be applied in a data read and can be selected based on a prior successful recovery of data read from the same or overlapping region of memory. Set the entry_index as the sticky voltage index, in other words: entry_index=sticky_voltage_index.

(3) If the entry_index is zero, then the entry_index is left shifted and set to the lowest negative offset (e.g., M+1). If entry_index is on the right of zero read offset voltage level, or in other words, if the voltage offset is greater than zero, then the entry index is left shifted by 1 to decrease the offset to a lesser value and move the read offset voltage closer to zero. However, if entry_index is within M+1 to N, the read offset voltage is negative, and the index is right shifted by 1 to decrease the magnitude of the negative read offset voltage to move the read offset voltage closer to zero. Note that if entry_index is M+1 (the lowest negative offset), then a right shift by 1 changes entry_index to 0.

(4) Another read operation is performed on the same region of memory using the adjusted read offset associated with the index selected in (3).

(5) If a read operation is successful, as indicated by the ECC indicating the read data is successfully recovered, the sticky voltage index is set to the entry index associated with the read offset voltage that yielded the successfully recovered read data. For example, if the index=1 that yielded the successfully recovered read data, then the sticky_voltage_index is set to 1. For example, if the index=9 that yielded the successfully received read data, then the sticky_voltage_index is set to 9. A subsequent read of any page or block in the same die as that of the data read successfully recovered can use that same read offset voltage value as indicated using sticky_voltage_index.

(6) However, if ECC fails and indicates the read data is erroneous or not successfully recovered, then syndrome weight Syndrm1 associated with the most recent unsuccessful data read is stored as variable Cur_Syndrm in order to track whether the syndrome weight increases, decreases, or stays the same relative to a syndrome weight associated with a prior read failure.

(7) A determination can be made if Cur_Syndrm<=Pre_Syndrm. In such case where Cur_Syndrm<=Pre_Syndrm:

(a) Set Min_Syndrm=Cur_Syndrm;
Set Min_idx=Entry index; and
Set Pre_Syndrm=Cur_Syndrm.

(b) If a right shift was applied to adjust a read voltage in a most recent failed read, i.e., index is increased on the positive voltage shift side (index >=0 and <=M) or index is decreased on the negative voltage shift side (index >M and <=N), then:

(i) if entry index right shifted by 1 has not been tried during the current cycle to read and re-read the region of memory, then right shift entry index by 1 and set read voltage based on the entry index and go to (4)

(ii) if entry index right shifted by 1 has been tried during the current cycle to read and re-read the region of memory, then perform a soft bit read (SBR) on the data read (or re-read) using the read voltage that produced the smallest syndrome weight, Min_Syndrm. If the SBR results in failure to recover the data, then go to (10).

(c) If a left shift was applied to adjust a read voltage in a most recent failed read, i.e., the index is decreased on the positive voltage shift side (index >=0 and <=M) or the index is increased on the negative voltage shift side (index >M and <=N), then:

(i) if a read operation using a read offset voltage associated with an entry index left shifted by 1 has not been tried during the current cycle to read and re-read the region of memory, then left shift by 1 the entry index and set the read voltage based on the entry index and go to (4)

(ii) if a read operation using a read offset voltage associated with an entry index left shifted by 1 has been tried during the current cycle to read and re-read the region of memory, then perform a soft bit read (SBR) on the data read (or re-read) using the read voltage that produced the smallest syndrome weight, Min_Syndrm. If the SBR results in failure to recover the data, then go to (10).

(8) If Cur_Syndrm>Pre_Syndrm, meaning that the syndrome weight has increased from that of a prior read attempt, then:

(a) If a right shift was applied to adjust a read voltage in a most recent failed read, i.e., index is increased on the positive voltage shift side or index is decreased on the negative voltage shift side, then:

(i) if a read operation using a read offset voltage associated with an entry index left shifted by 2 has not been tried during the current cycle to read and re-read the region of memory, then left shift by 2 the entry index and set the read voltage based on the entry index left shifted by 2 and go to (4)

(ii) if a read operation using a read offset voltage associated with an entry index left shifted by 2 has been tried during the current cycle to read and re-read the region of memory, then perform a soft bit read (SBR) on the data read (or re-read) using the read voltage that produced the smallest syndrome weight, Min_Syndrm. If the SBR results in failure to recover the data, then go to (10).

(b) If a left shift was applied to adjust a read voltage in a most recent failed read, i.e. the index is decreased on the positive voltage shift side or the index was increased on the negative voltage shift side, then:

a. if a read operation using a read offset voltage associated with an entry index right shifted by 2 has not been tried during the current cycle to read and re-read the region of memory, then right shift by 2 the entry index and set the read voltage based on the entry index right shifted by 2 and go to (4)

b. if a read operation using a read offset voltage associated with an entry index right shifted by 2 has been tried during the current cycle to read and re-read the region of memory, then perform a soft bit read (SBR) on the data read (or re-read) using the read voltage that produced the smallest syndrome weight, Min_Syndrm. If the SBR results in failure to recover the data, then go to (10).

In (7) and (8), a determination of whether a read offset voltage was previously attempted can be made on the same page in a prior read request to a re-try effort or even in a read request prior to a current cycle of read and re-try effort(s).

(9) If a read is successfully recovered by SBR, then allow the read data to be surfaced to the host or other device that requested the data; else repeat (4) with each MRR entry which was not tried in until a read is successfully recovered.

(10) If a read cannot be successfully recovered even if all MRR entries have been tried (including use of SBR), then apply an exclusive OR (XOR) operation to recover the requested data.

Memory device 306 can be any single or multiple memory and/or storage devices. Various embodiments of memory device 306 can be used as described with respect to memory 122 (FIG. 1). Memory device 306 can store codewords that include data and associated parity bits as well as parity bits used to recover data in an XOR data recovery operation. Memory device 306 can be a single die or multiple dice of memory devices.

Buffer 308 can store data retrieved from memory 306 in connection with a read operation. Decoder 310 can apply decoding on the retrieved data to determine if the data was successfully recovered. ECC decoder 312 can decode retrieved data from stored codewords and attempt to correct error(s) in retrieved data. ECC decoder 312 can output a syndrome weight for each decoded codeword no matter whether decoding is successful or not. ECC decoder 312 can use an LDPC decoding technique to determine if a calculated syndrome weight is zero or non-zero. For a read channel task, error calculation device 314 can determine an average syndrome weight over all codewords in a plane. Error calculation device 314 can accumulate total syndrome weights over all the codewords in each plane and divide total plane syndrome weight by a total number of codewords in each plane to determine average syndrome weight per plane. A plane can store multiple codewords. Dividing total plane syndrome weight by total number of codewords in each plane provides an average syndrome weight per plane. Accordingly, a syndrome weight can represent an average syndrome weight per codeword retrieved from a plane. While the examples provided herein with regard to error calculation device 314 have referred to a plane, other sized regions of memory can be supported, including but not limited to a block, page, or smaller region.

Lowest syndrome weight, index, and data 316 can store a lowest syndrome weight and its corresponding index and the corresponding data associated with the lowest syndrome weight read from memory device 306 but that ECC 312 failed to recover. In some cases, such stored data is associated with a lowest syndrome weight value. Data stored in syndrome weight, index, and data 316 can be used by soft bit read (SBR) logic 307 to recover data using soft bit recovery. SBR logic 307 can perform one or more of: read the unrecovered data with multiple strobes, obtain reliability information, map a log likelihood radio (LLR) corresponding value, and apply an LDPC decode to use soft decision decoding to decode and correct errors in the data, which could correct errors in the unrecovered data.

XOR data recovery logic 320 can provide recovery of data using an XOR operation in the event of a data read failure. An XOR operation can be applied on incoming data packets to generate XOR parity information and such generated XOR parity information can be used in a data recovery operation using XOR. Memory 306 may maintain XOR parity information that may be used to recover the user data in the codeword if the codeword cannot be decoded. If there are bit errors resulting in a failure of the decode operation when decoding a codeword from the region of memory, the parity information for the codeword in the parity region may be XOR'd with codeword stored in one or more regions of memory other than the region that failed the decode.

FIGS. 4A-4E show a flow diagram of a process 400 that can be used to determine a voltage offset to a reference read voltage to apply in a memory read or re-read operation. The process can be applied or requested to be applied by a memory controller, a storage controller or a host device. For example, one or more components of system 300 can perform process 400. At 402 (FIG. 4A), an initial read offset voltage can be selected for use by a read circuitry to apply a voltage to one or more regions (e.g., plane, page, block, byte, or any sized region of memory) of a memory device. The initial read offset voltage can be specified using an index called a sticky index. The sticky index can be used to store an index associated with a prior read offset voltage that was applied to the same, overlapping or nearby region of memory. The prior read offset voltage could have resulted in a successful recovery of data with or without use of SBR or with or without any re-read the region. If a prior read operation was not performed, the sticky index can be set to zero. In addition, an Entry index can be set to equal the Sticky index. The Entry index can be used to track the index used in a memory re-read, if applicable.

At 404, a read request can be made using a read voltage based on the initial read offset voltage selected at 402. At 406, a read operation in the memory device can take place at a desired region using the read voltage based on the initial read offset voltage. At 408, a determination can be made whether the read operation was successful. For example, a read operation can be considered successful if the region was successfully read from memory or is successfully read from memory and stored data is also successfully recovered. For example, an ECC scheme can be used to invoke an LDPC decoding technique to determine if a calculated syndrome weight is zero or has no unrecoverable errors. If the read operation is successful, then 450 can follow. At 450, the initial offset associated with the successful read operation can be stored for subsequent use such as another use of process 400. For example, variable Sticky index can be used to store an index value associated with the initial offset value.

However, if the read operation is not successful, then 410 provides for storing an error level indicator associated with the determination that the read was unsuccessfully recovered. In some embodiments, a syndrome weight associated with an LDPC decode of the read data can be recorded as both the lowest measured error level indicator (variable Min_Syndrm) and also recorded as a previous error level indicator (variable Pre_Syndrm). Variable Min_idx can be used to store the index associated with the offset that yielded the lowest detected error level indicator to this point. Variable Min_idx is set as the sticky index, variable Sticky index, as the associated syndrome weight is the lowest detected error to this point. At 412, the current index that was associated with an error is tracked. Variable Entry index can be set to equal Sticky index at 412.

At 414 (FIG. 4B), a determination is made as to whether the read voltage offset is within range that is zero or positive. In other words, referring to Table 1 above, the determination at 414 can be made as to whether the current index (Entry index) is greater than or equal to 0 and less than or equal to M. If the index associated with the unsuccessful read at 408 is within the zero to positive offset range, then 416 follows and the current index value is left shifted by 1 to provide the next candidate index value. If the index is 0, left shifting the index by 1 changes the index to 7 (smallest negative offset). If the index is any of 1 to M, left shifting the index by 1 decreases the index value by 1.

If at 414, the read voltage offset is found to be outside the zero to positive range, then 452 follows. In other words, if a determination is made that the index is within the negative offset range (e.g., M+1 to N), then 452 follows. At 452, the index can be right shifted by 1. If the index is M+1, right shifting the index by 1 changes the index to 0. If the index is M+2 to N, right shifting the index decreases the index value by 1.

At 418, a next applied read offset voltage can be selected based on the next candidate index selected at 416 or 452. At 420, a read request can be made using a read voltage based on the next candidate read offset voltage selected at 418. At 422, a read operation in the memory device can take place at the same region of memory using the read voltage based on the next candidate read offset voltage provided at 418. At 424, a determination can be made whether the read operation was successful using a manner similar to that of 408.

If the read operation was successful, then at 426, the index associated with the candidate read voltage used to achieve a successful read is stored for future use. Variable Sticky index can be used to store that candidate read voltage. At 428, the read data can be output and made available to the requester.

If the read operation was not successful, then at 430, the error level indicator associated with the unsuccessful data read performed in 422 is read and stored. Variable Cur_Syndrm can be used to store the error level indicator. In some embodiments, the error level indicator can be a syndrome weight calculated by an LDPC decoder or an LDPC decode operation.

At 432 (FIG. 4C), a determination is made if the error level indicator values associated with two or more read operations are decreasing or staying the same, showing that the error level associated with read operations is decreasing or steady. The two or more read operations can be successive read operations (consecutive, partially consecutive or not consecutive) of the same region of memory. For example, the most recent tracked error level indicator, tracked using variable Cur_Syndrm can be compared against a previous error level indicator tracked in variable Pre_Syndrm (from 410). If Cur_Syndrom is less than or equal to Pre_Syndrm, then 432 determines that the error level indicator values associated with two or more read operations are decreasing or staying steady and 434 follows. If the error level indicator values associated with two or more read operations are increasing, then 442 follows. A description of 442 follows the description of 462.

At 434, the current error level indicator is tracked as the lowest detected error level indicator and an index associated with the voltage offset that yielded the read failure is tracked. For example, variable Min_Syndrm can be set to equal Cur_Syndrm (the error level indicator associated with the read failure detected in 430, if it is the lowest syndrome weight in the current read and re-read cycle), variable Min_idx can be set to the next candidate index from 418, and variable Pre_Syndrm can be set to equal Cur_Syndrm.

At 436, a determination is made as to whether an adjustment to the read offset voltage that yielded an unsuccessful read was associated with a right shift to the index. If so, then at 438, a determination is made as to whether the read offset voltage associated with another right shift by 1 to the index had been previously used in a read or read re-try. If the read offset voltage associated with another right shift by 1 to the index had not been previously used in the current read or read re-try cycle, then 440 follows and the index associated with the right shift by 1 to the index is selected for use as the next candidate index and 418 (FIG. 4B) follows. If the read offset voltage associated with a right shift by 1 to the index had been previously used in a read or read re-try, then 480 follows where a soft bit read recovery is requested to be performed.

However, if 436 determines that an adjustment to the read offset voltage that yielded a read failure was associated with a left shift to the index, then at 460 (FIG. 4D), a determination is made whether the read offset associated with the current index left shifted by 1 was previously used in a read or read re-try. If the read offset associated with the current index left shifted by 1 was previously used in the current read or read re-try cycle, then 480 follows where a soft bit read recovery is requested to be performed. If the read offset voltage associated with the current index value left shifted by 1 was not previously used in a read or read re-try, then at 462, the entry index is left shifted by 1 and 418 follows using the read offset voltage associated with the current index value left shifted by 1.

Figure 4A:
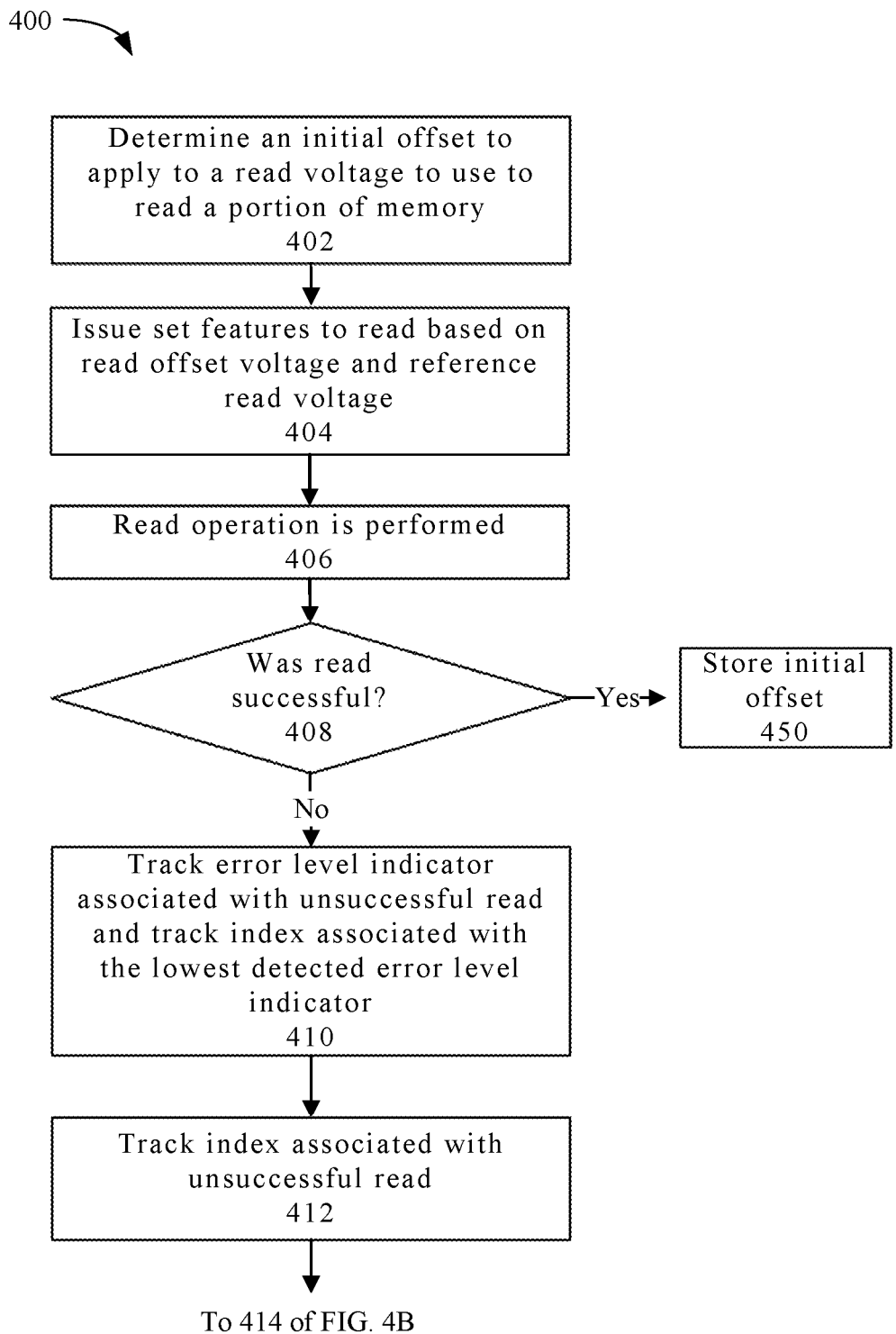
FIGS. 4A-4E illustrate a flow diagram of a process that can be used to determine a voltage offset to a reference read voltage to apply in a read operation.
Figure 4B:
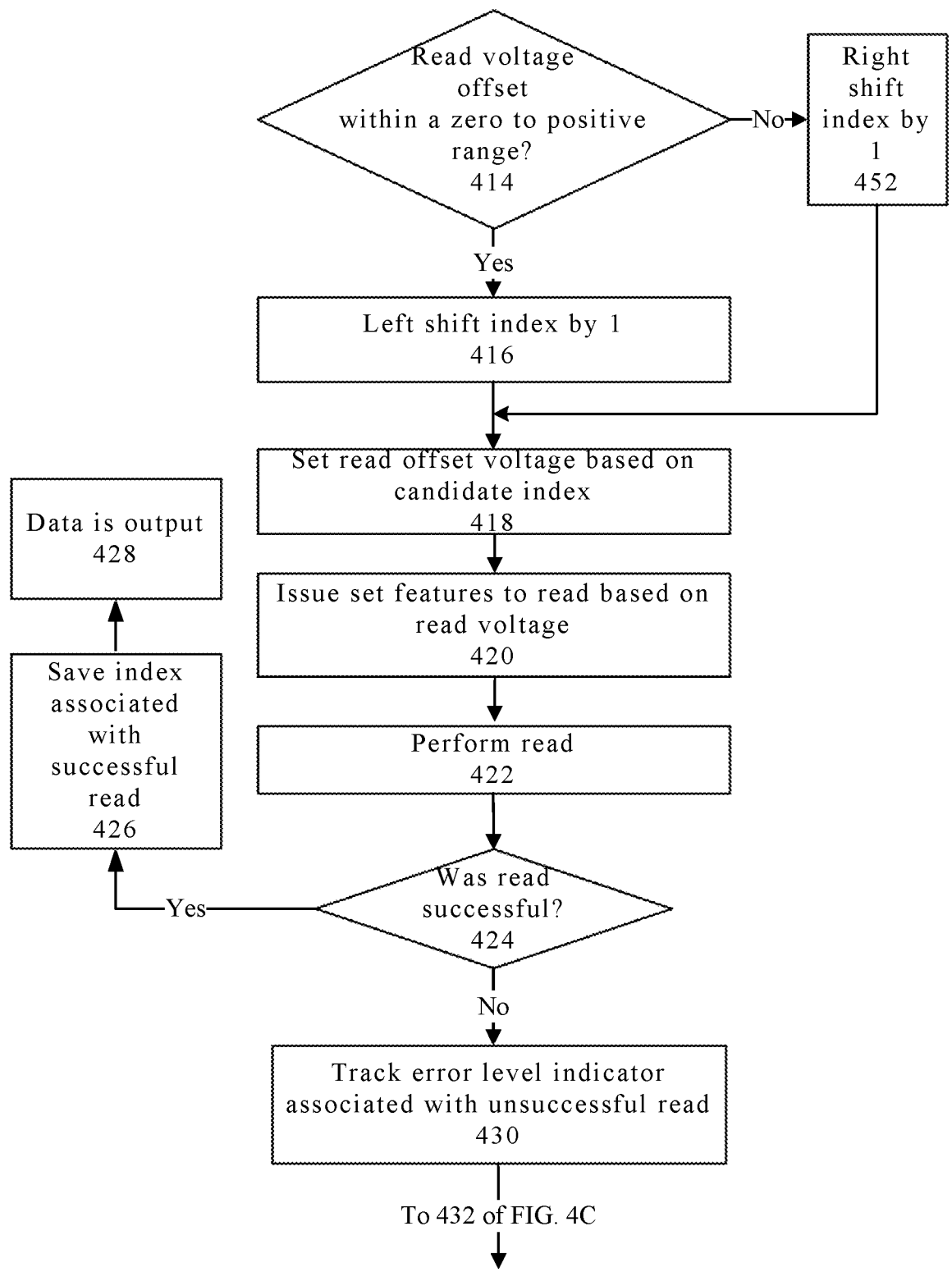
Figure 4C:
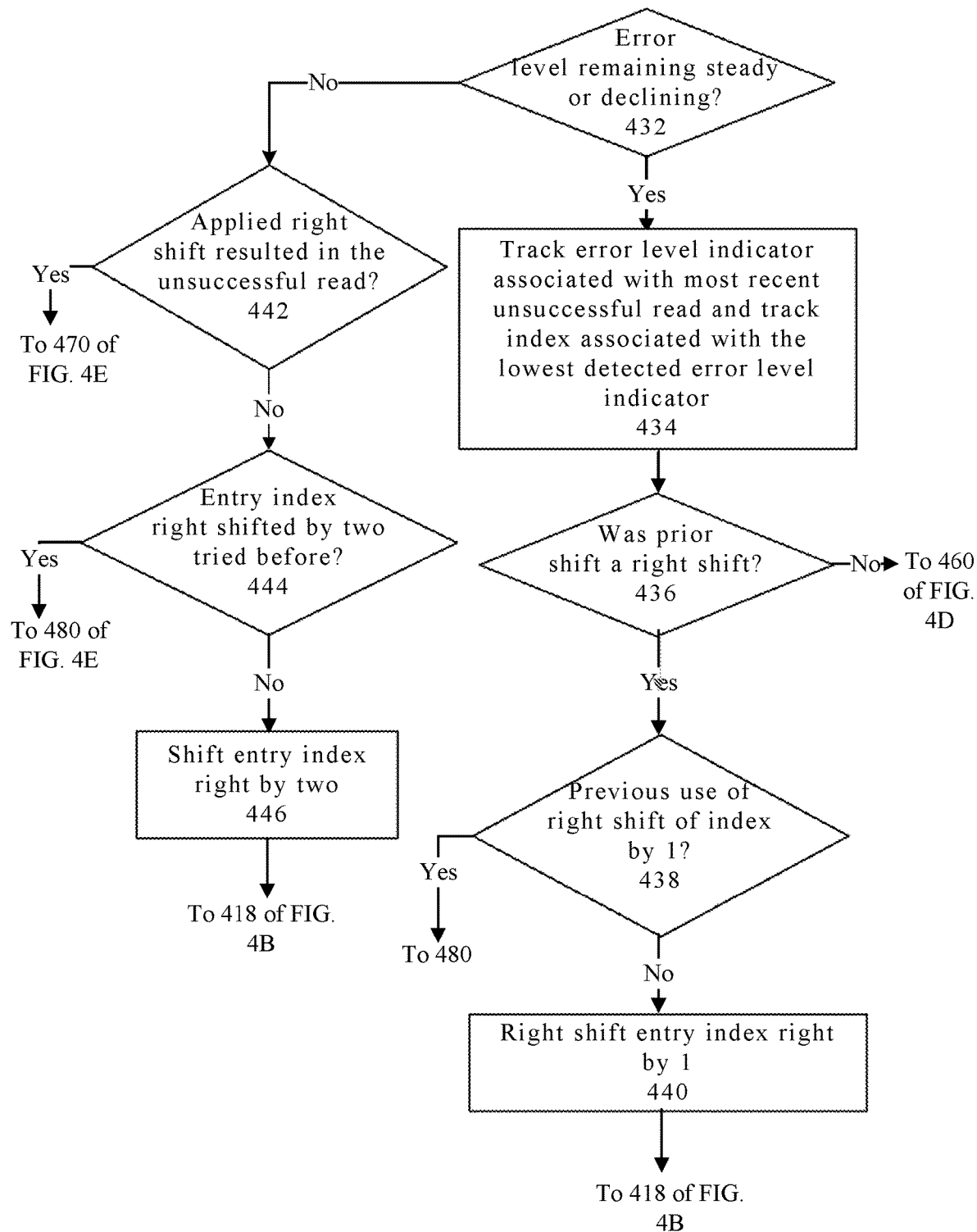
Figure 4D:
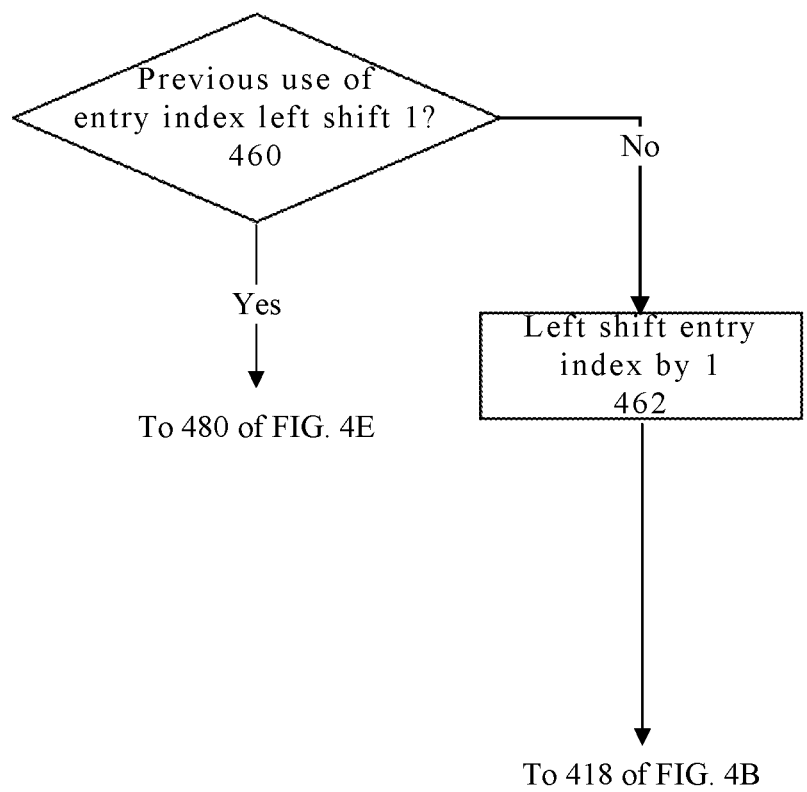
Figure 4E:
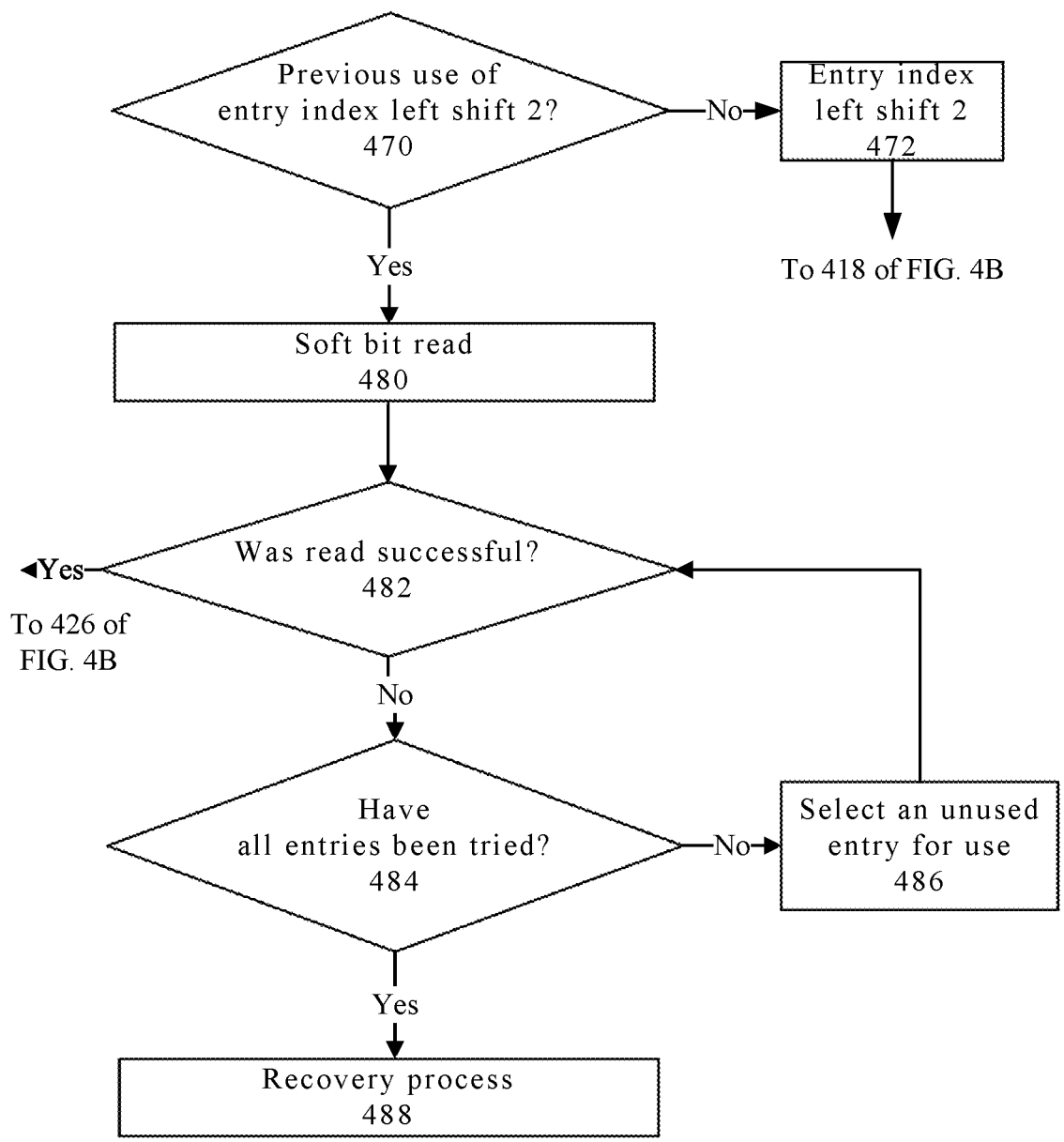

Referring to FIG. 4C, the branch from and including 442 can try to select an index that is the opposite direction from the index that was chosen that lead to an unsuccessful read. At 442, if a right shift operation was applied to a most recently used index but yielded an unsuccessful read, then 470 (FIG. 4E) follows and the candidate index would be the index to the opposite direction (to the left) of the index used two reads before (or an index left shift of 2). For example, if an index of 2 (positive offset) was used first, an index of 3 (larger positive offset) was used second, then 442 would select a candidate index of 1. As another example, if an index of 10 (negative offset) was used first, an index of 9 (smaller negative offset) was used second, then 470 would select a candidate index of 11 (negative offset of larger magnitude than that corresponding to an index of 10). If the candidate index selected in 470 and the associated read offset voltage was not used, then 472 (FIG. 4E) selected the candidate index as the left shift of 2 of the current index (FIG. 4B) and action 418 (FIG. 4B) would attempt a re-read using the index selected in 472. If the candidate index that would reverse the direction of changes in read offset voltages has already been chosen and the associated read offset voltage was used, then 480 (FIG. 4E) follows.

Referring to FIG. 4C, if 442 determines a left shift operation was applied to a most recently used index but yielded an unsuccessful read, then 444 follows where a candidate index would be selected as an index to the opposite direction relative to the index associated with two prior reads before. For example, if an index of 4 (positive offset) was used first, an index of 3 was used second, then 444 would select a candidate index of 5. As another example, if an index of 10 (negative offset) was used first, an index of 11 was used second, then 444 would select a candidate index of 9. At 444, a determination is made as to whether the selected candidate index has been tried before in this iteration of process 400. If the selected candidate index has not been tried before in this iteration of process 400, then the candidate index is selected in 446 and 418 (FIG. 4B) follows using the selected candidate index. Variable Entry index can be set to the selected candidate index value selected at 442.

However, if the candidate index evaluated in 444 was used before in this iteration of process 400, then 480 (FIG. 4E) follows.

At 480 (FIG. 4E), a soft bit read (SBR) on the data read using the read voltage that produced the smallest syndrome weight, Min_Syndrm. Data reads and corresponding syndrome weights can be stored and available in case a soft bit read is used. A soft bit read can involve one or more of: reading the data multiple times via multiple strobes, obtaining reliability information, and mapping a log likelihood radio (LLR) corresponding value. LDPC can use soft decision decoding to decode the data, which could correct errors.

At 482, a determination is made if the SBR operation yielded a successful read operation. If so, then the recovered data can be output or made available to the requester. In some cases, the recovered data can be stored so that it is available for reading in the event the same region of memory is requested to be ready and SBR can be avoided. If 480 provides a successful read operation, then the variable sticky index can be set to the index associated with the offset used to read data with the lowest syndrome weight and that was used in the successful read operation.

However, if the SBR operation did not yield a successful read operation, then 484 can be performed. At 484 and 486, an unused index in the current iteration of process 400 can be selected and provided for use as a read offset voltage. An order of selecting unused read offset voltages can include selecting and using a smaller voltage offset before selecting and using a larger voltage offset. A cycle of 484, 486, and 482 can repeat until all read offset values are used. If a successful read operation results from the cycle of 484, 486, and 482, then 426 of FIG. 4B can follow.

After all entries have been tried but data recovery was not successful, then at 488, a recovery process can be used to recover the data. For example, an XOR data recovery process can be applied using parity bits associated with the data. If a successful read operation results using the XOR data recovery process, then the recovered data can be output or made available to the requester. In some cases, the recovered data can be stored so that it is available for reading in the event the same region of memory is requested to be read. For a successful or unsuccessful XOR data recovery process, the sticky index can be set to the index associated with the lowest syndrome weight and the sticky index can be used in a later read operation.

Figure 5:
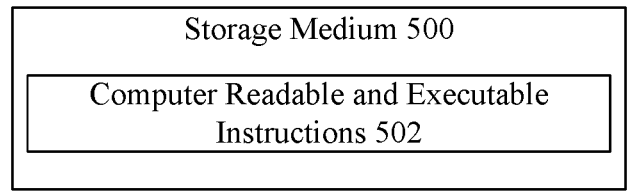
FIG. 5 illustrates an embodiment of a storage medium.

FIG. 5 illustrates an embodiment of a storage medium 500. The storage medium 500 may include an article of manufacture. In some examples, storage medium 500 may include any non-transitory computer readable medium or machine readable medium, such as an optical, magnetic or semiconductor storage. Storage medium 500 may store various types of computer executable instructions, such as instructions to implement process 400 or anything described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like.

Figure 6:
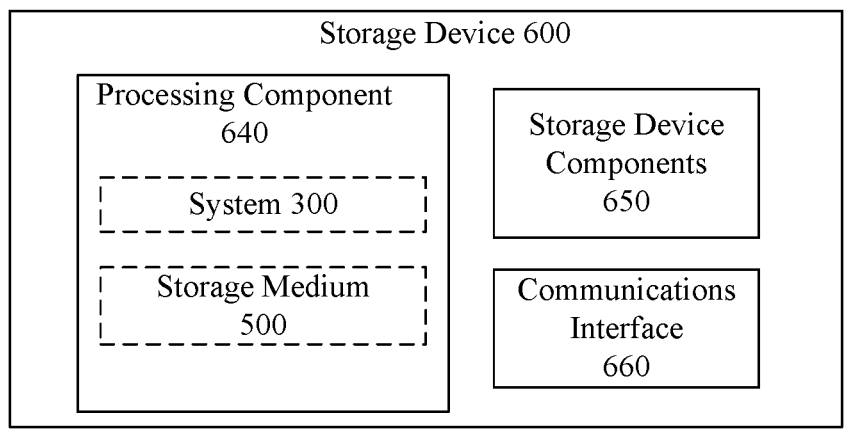
FIG. 6 illustrates an example storage device.

FIG. 6 illustrates an example storage device 600. In some examples, as shown in FIG. 6, storage device 600 may include a processing component 640, storage device components 650, or a communications interface 660. According to some examples, storage device 600 may be capable of being coupled to a host computing device or platform.

According to some examples, processing component 640 may execute processing operations or logic for system 300, process 400, storage medium 600, and/or any activity described herein. Processing component 640 may include various hardware elements, software elements, or a combination of both.

In some examples, storage device components 650 may include common computing elements or circuitry, such as one or more processors, multi-core processors, co-processors, memory units, chipsets, controllers, interfaces, oscillators, timing devices, power supplies, and so forth. Examples of memory units may include without limitation various types of computer readable and/or machine-readable storage media any other type of volatile or non-volatile storage media suitable for storing information.

In some examples, communications interface 660 may include logic and/or features to support a communication interface. For these examples, communications interface 660 may include one or more communication interfaces that operate according to various communication protocols or standards to communicate over wired or wireless communication links.

Storage device 600 may be configured as an SSD or an HDD that may be configured as described above for storage device 120 of system 100 as shown in FIG. 1. Accordingly, functions and/or specific configurations of storage device 600 described herein, may be included or omitted in various embodiments of storage device 600, as suitably desired.

Figure 7:
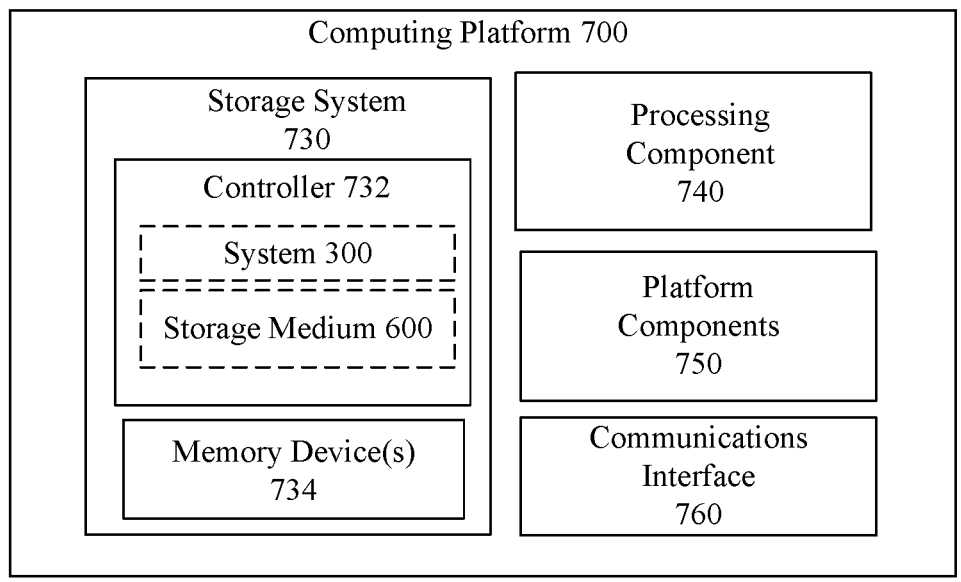
FIG. 7 illustrates an example computing platform.

FIG. 7 illustrates an example computing platform 700. In some examples, as shown in FIG. 7, computing platform 700 may include one or more of: a storage system 730, a processing component 740, platform components 750, or a communications interface 760.

According to some examples, storage system 730 may be similar to memory device 122 of system 100 as shown in FIG. 1 and includes a controller 732 and memory devices(s) 734. For these examples, logic and/or features resident at or located at controller 732 may execute at least some processing operations or logic for system 300, process 400, or any other activities described herein and may include storage media that includes storage medium 600. Also, memory device(s) 734 may include similar types of volatile or non-volatile memory (not shown) that are described above for memory device 122.

According to some examples, processing component 740 may include various hardware elements, software elements, or a combination of both. In some examples, platform components 750 may include common computing elements, such as one or more processors, single or multi-cores, co-processors, memory units, chipsets, controllers, peripherals, interfaces, oscillators, timing devices, video cards, audio cards, multimedia I/O components (e.g., digital displays), power supplies, and so forth. Examples of memory units associated with either platform components 750 or storage system 730 may include without limitation, various types of computer readable and machine-readable storage media.

In some examples, communications interface 760 may include logic and/or features to support a communication interface. For these examples, communications interface 760 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification.

Communications interface 760 can include radio frequency (RF) transceiver components for accessing wireless voice and/or data networks (e.g., using cellular telephone technology, data network technology such as 3G, 4G/LTE, Wi Fi, other IEEE 802.11 family standards, or other mobile communication technologies, or any combination thereof), components for short range wireless communication (e.g., using Bluetooth® and/or Bluetooth® LE standards, NFC, etc.), and/or other components. In some embodiments, communications interface 760 can provide wired network connectivity (e.g., Ethernet) in addition to or instead of a wireless interface. Communications interface 760 can be implemented using a combination of hardware (e.g., driver circuits, antennas, modulators/demodulators, encoders/decoders, and other analog and/or digital signal processing circuits) and software components. In some embodiments, communications interface 760 can support multiple communication channels concurrently or at different times, using the same transport or different transports.

Computing platform 700 may be part of a computing device that may be, for example, user equipment, a computer, a personal computer (PC), a desktop computer, a laptop computer, a notebook computer, a netbook computer, a tablet, a smart phone, virtual reality or augment reality device, autonomous driving or flying vehicle, Internet-of-things (IoT) device, embedded electronics, a gaming console, a server, a server array or server farm, a web server, a network server, a proxy device, a work station, a minicomputer, a main frame computer, a supercomputer, a network appliance, a web appliance, a distributed computing system, multiprocessor systems, processor-based systems, or combination thereof. Accordingly, functions and/or specific configurations of computing platform 700 described herein, may be included or omitted in various embodiments of computing platform 700, as suitably desired.

The components and features of computing platform 700 may be implemented using any combination of discrete circuitry, ASICs, field programmable gate arrays (FPGAs), logic gates and/or single chip architectures. Further, the features of computing platform 700 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

The appearances of the phrase "one example" or "an example" are not necessarily all referring to the same example or embodiment. Any aspect described herein can be combined with any other aspect or similar aspect described herein, regardless of whether the aspects are described with respect to the same figure or element.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

What is claimed is:

1. An apparatus comprising:
   an interface to communicate with one or more memory devices and
   a controller that includes logic, at least a portion of which comprises hardware, the logic to:
      select a read voltage value for use in a read of a region of the one or more memory devices;
      in response to an unsuccessful read of the region, determine an error level associated with the unsuccessful read and select a second read voltage value for use to read the region of the one or more memory devices; and
      in response to an unsuccessful read of the region of the one or more memory devices using the second read voltage value, determine a second error level associated with the unsuccessful read using the second read voltage value and select a third voltage value for use in a re-read operation based at least in part on a change between the second error level from the error level, wherein
      in response to the second error level being greater than the error level:
         based on the second read voltage value being greater than the read voltage value, select a third voltage value that is less than the read voltage value or
         based on the second read voltage value being less than the read voltage value, select a third voltage value that is greater than the read voltage value.

2. The apparatus of claim 1, wherein the logic is to:
   determine the error level using a low-density parity-check (LDPC) and
   determine the second error level using a low-density parity-check (LDPC).

3. The apparatus of claim 1, wherein the error level comprises a syndrome weight and the second error level comprises a syndrome weight.

4. The apparatus of claim 1, wherein the logic is to:
   apply a soft bit read to recover data in response to the selected third voltage having been applied in a read or re-read of the region.

5. The apparatus of claim 1, wherein the logic is to:
   apply an XOR error recovery in response to failure to recover data using a soft bit read using a set of available read offset voltages.

6. The apparatus of claim 1, wherein the unsuccessful read of the region comprises one or more of: an unsuccessful read of data from the region or unsuccessful error recovery of data read from the region.

7. The apparatus of claim 1, further comprising the one or more memory devices and wherein the one or more memory devices include non-volatile or volatile types of memory and the one or memory devices are communicatively coupled to the interface.

8. The apparatus of claim 1, further comprising one or more of:
   at least one processor communicatively coupled to the controller;
   a wireless network interface communicatively coupled to the at least one processor;
   a display communicatively coupled to the at least one processor; or
   a battery communicatively coupled to the at least one processor.

9. The apparatus of claim 1, wherein to select the third voltage value, the logic is to:
   in response to a determination that the second error level is less than or equal to the error level:
      based on the second read voltage value being less than the read voltage value, select the third voltage value to be less than the second read voltage value or
      based on the second read voltage value being more than the read voltage value, select the third voltage value to be greater than the second read voltage value.

10. A method comprising:
    applying a first read offset voltage to read a region of a memory device;
    in response to an unsuccessful read based on the first read offset voltage, storing a first error level indicator associated with the first read offset voltage;
    in response to an unsuccessful read based on the first read offset voltage, determining a second read offset voltage to apply in a re-read of the region of the memory device;
    in response to an unsuccessful read based on the second read offset voltage, storing a second error level indicator associated with the second read offset voltage; and
    in response to an unsuccessful read based on the second read offset voltage, determining a third read offset voltage to apply in a re-read of the region of the memory device based, at least in part, on a comparison between the second error level indicator and the first error level indicator, wherein:
       in response to the second error level indicator being greater than the first error level indicator:
          based on the second read voltage value being greater than the first read offset voltage value, selecting a third read offset voltage value that is less than the first read offset voltage value or
          based on the second read offset voltage value being less than the first read offset voltage value, select a third read offset voltage value that is greater than the first read offset voltage value.

11. The method of claim 10, wherein the first error level indicator comprises a syndrome weight and the second error level indicator comprises a syndrome weight.

12. The method of claim 10, further comprising:
    applying a soft bit read to recover at least a portion of data from the region in response to unsuccessful reads after use of available read offset voltages and applying an XOR recovery scheme in response to an unsuccessful read using at least one soft bit read.

13. The method of claim 10, wherein determining a third read offset voltage to apply in a re-read of the region of the memory device based, at least in part, on a comparison between the second error level indicator and the first error level indicator comprises:
   in response to a determination that the second error level indicator is less than or equal to the first error level indicator:
      based at least in part on the second read offset voltage being less than the first read offset voltage, determining the third read offset voltage that is less than the second read offset voltage or
      based on the second read offset voltage being more than the first read offset voltage, determining the third read offset voltage that is greater than the second read offset voltage.

14. A system comprising:
   a host computing system;
   one or more memory devices; and
   a controller communicatively coupled to the host computing system and at least one of the one or more memory devices, the controller to:
      select a read voltage value for use in a read of a region of the one or more memory devices;
      in response to an unsuccessful read of the region, determine an error level associated with the unsuccessful read and select a second read voltage value for use to re-read the region of the one or more memory devices; and
      in response to an unsuccessful read of the region of the one or more memory devices using the second read voltage value, determine a second error level associated with the unsuccessful read using the second read voltage value and select a third voltage value to use to re-read the region based at least in part on a change between the second error level from the error level, wherein:
         in response to the second error level being greater than the error level:
            based on the second read voltage value being greater than the read voltage value, select the third voltage value that is less than the read voltage value or
            based on the second read voltage value being less than the read voltage value, select the third voltage value that is greater than the read voltage value.

15. The system of claim 14, wherein the error level comprises a syndrome weight and the second error level comprises a syndrome weight.

16. The system of claim 14, wherein the controller is to:
   apply a soft bit read to recover data in response to the selected third voltage having been applied in the read or re-read of the region.

17. The system of claim 14, wherein the controller is to:
   apply an XOR error recovery in response to failure to recover data using a soft bit read using a set of available read offset voltages.

18. The system of claim 14, wherein to select the third voltage value, the controller is to:
   in response to a determination that the second error level is less than or equal to the error level:
      based on the second read voltage value being less than the read voltage value, select the third voltage value that is less than the second read voltage value or
      based on the second read voltage value being more than the read voltage value, select the third voltage value that is greater than the second read voltage value.

* * * * *